United States Patent [19]
Dutta et al.

[11] Patent Number: 5,301,201
[45] Date of Patent: Apr. 5, 1994

[54] ARTICLE COMPRISING A TUNABLE SEMICONDUCTOR LASER

[75] Inventors: Niloy K. Dutta, Colonia; Daryoosh Vakhshoori, Scotch Plains, both of N.J.

[73] Assignee: AT&T Bell Laboratories, Murray Hill, N.J.

[21] Appl. No.: 26,364

[22] Filed: Mar. 1, 1993

[51] Int. Cl.[5] .................. H01S 3/107; H01S 3/101; H01S 3/19
[52] U.S. Cl. .................................... 372/43; 372/20; 372/101
[58] Field of Search ........... 372/12, 20, 28, 22, 372/23, 50, 46, 45, 44, 43, 101; 257/98

[56] References Cited
FOREIGN PATENT DOCUMENTS
| | | | |
|---|---|---|---|
| 0021987 | 1/1989 | Japan | 372/43 |
| 0011689 | 1/1991 | Japan | 372/43 |
| 0046384 | 2/1991 | Japan | 372/45 |

OTHER PUBLICATIONS
"Monolithically Peltier-cooled vertical-cavity surface-emitting lasers", by Paul R. Berger et al., Applied Physics Lett., vol. 59(1), Jul. 1, 1991, pp. 117-119.

"Low Voltage Wavelength Tuning of an External Cavity Diode Laser Using a Nematic Liquid Crystal-Containing Birefringent Filter", by John R. Andrews, *IEEE Photonics Technology Letters*, vol. 2, No. 5, May 1990, pp. 334-336.

"Tunable Light Source Using a Liquid-Crystal Fabry-Perot Interferometer", by Hiroyuki Tsuda et al., *IEEE Phonics Technology Letters*, vol. 3, No. 6, Jun. 1991, pp. 504-506.

"Tunable wavelength conversion using a liquid crystal filter and a bistable laser diode", by Hiroyuki Tsuda et al., *Applied Physics Letters*, vol. 61 (17), Oct. 26, 1992, pp. 2006-2008.

"Electronically tuned diode-laser-pumped Cr:LiSrAlF sub 6 laser", by Qi Zhang, et al., *Optics Letters*, vol. 17(1), Jan. 1, 1992, pp. 43-45.

*Primary Examiner*—Rodney B. Bovernick
*Assistant Examiner*—Robert McNutt
*Attorney, Agent, or Firm*—Eugen E. Pacher

[57] ABSTRACT

The disclosed tunable (wavelength and/or focal length) laser typically is a surface emitting laser that comprises a multilayer structure that comprises the lower Bragg reflector and the active region. A layer of electro-optic material (typically liquid crystal material) is in contact with the top surface of the multilayer structure, and means are provided for applying a voltage across the layer of electro-optic material. In one exemplary embodiment, the layer is inside the laser cavity, making the laser wavelength tunable. In another exemplary embodiment the laser is a Z-laser that focuses the output radiation, with the multilayer structure comprising also the upper Bragg reflector. In this embodiment the layer of electro-optic material is outside the laser cavity, and the laser has tunable focal length. A still further embodiment is both wavelength- and focal length-tunable. Lasers according to the invention can be advantageously used in a variety of applications, e.g., in a wavelength division multiplexed and/or optically amplified optical fiber communication system.

8 Claims, 2 Drawing Sheets

ARTICLE COMPRISING A TUNABLE SEMICONDUCTOR LASER

FIELD OF THE INVENTION

This invention pertains to articles (e.g., a wavelength division multiplexed (WDM) optical communication systems) that comprise a tunable semiconductor laser.

BACKGROUND OF THE INVENTION

Wavelength tunable semiconductor lasers are key components in many technological systems, exemplarily WDM optical fiber communication systems, and such lasers are known. For instance, P. R. Berger et al., *Applied Physics Letters*, Vol. 59, p. 117 (1991) discloses a surface emitting laser (SEL) that utilizes the Peltier effect of the substrate to achieve thermally induced tuning. However, this effect allows only a relatively small tuning range (typically about 1 nm). A semiconductor laser having much larger (e.g., >10 nm) tuning range would be of significant technological interest.

Electro-optic tuning of lasers by means that comprise liquid crystal material is known. However, the prior art devices typically involve an external cavity, with a separate liquid crystal-containing element in the external cavity. See, for instance, J. R. Andrews, *IEEE Photonics Technology Letters*, Vol. 2(5), p. 334; H. Tsuda et al., *IEEE Photonics Technology Letters*, Vol. 3(6), p. 504; H. Tsuda et al., *Applied Physics Letters*, Vol. 61(17), p. 2006; and Qi Zhang et al., *Optics Letters*, Vol. 17(1), p. 43. Such light sources typically comprise a multiplicity of components in addition to the laser diode and thus typically would be inconvenient to use. This application inter alia discloses a simple, compact, wavelength-tunable semiconductor laser having a relatively large tuning range.

SUMMARY OF THE INVENTION

In a broad aspect the invention is embodied in an article (e.g., an optical communications system) that comprises tunable (wavelength and/or focal distance) laser means, typically comprising a vertical cavity surface emitting laser (VCSEL).

Typically, the laser means comprise a first body that has a major surface and comprises a semiconductor layer structure that includes multilayer semiconductor reflection means and an active region that is located between the reflection means and the major surface. The reflection means and the active region are essentially parallel with the surface. The laser means further comprise first contact means that facilitate flowing an electric current through the semiconductor layer structure such that the laser means emits output radiation. Still furthermore, the laser means comprise a quantity of electro-optic material (exemplarily liquid crystal material), and also comprise second contact means that facilitate applying an electric field across the electro-optic material.

Significantly, the quantity of electro-optic material comprises a layer that is in contact with the major surface. The second contact means comprise a first and a second contact layer, with the first body comprising the first contact layer, and the second body comprising the second contact layer. Furthermore, the laser means comprise means for maintaining the second body in fixed relationship with the first body.

In an exemplary embodiment, the second body comprises reflection means that are essentially parallel with the major surface. In this embodiment the wavelength of the output radiation is a function of the electric field that is applied across the layer of electro-optic material.

In a further exemplary embodiment, the first body comprises further reflection means that are essentially parallel with the major surface and are located between the active region and the major surface. The first body furthermore comprises means for bringing the radiation output substantially to a focus. The focal length (typically the distance between the focus and the major surface) is a function of the electric field that is applied across the layer of electro-optic material.

In a still further embodiment, both the output wavelength and the focal distance are a function of the electric field that is applied across the layer of electro-optic material.

By "electro-optic material" we mean herein a dielectric material which has a refractive index (or indices) that can be varied by means of an applied electric field. Desirably, the normalized variation is at least 5% per kV/cm. Exemplary electro-optic materials are liquid crystals and lithium niobate.

No attempt has been made to represent dimensions and/or proportions accurately.

DETAILED DESCRIPTION OF EXEMPLARY EMBODIMENTS

Figure 1:
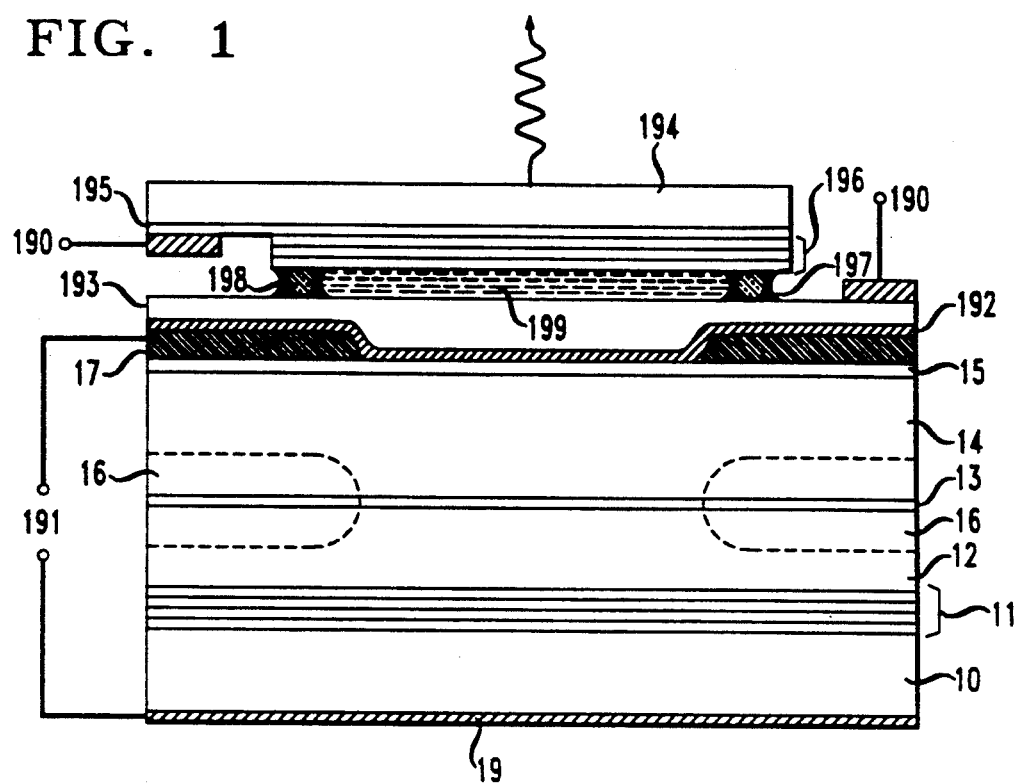
FIGS. 1–3 schematically depict exemplary embodiments of laser means according to the invention, namely, a wavelength-tunable VCSEL, a focal length-tunable VCSEL and a wavelength and focal length-tunable VCSEL, respectively.

FIG. 1 schematically depicts exemplary wavelength-tunable laser means. The semiconductor layer structure comprises n-type semiconductor (e.g., $2 \times 10^{18}$ cm$^{-3}$ GaAs) substrate 10, multilayer n-type semiconductor reflection means 11 (e.g., 30 pairs of AlAs/Al$_{0.16}$Ga$_{0.84}$As layers, each layer of thickness $\lambda/4$, where $\lambda$ is the wavelength in the medium), lightly n-type lower cladding layer 12 (e.g., 1.5 μm $10^{17}$ cm$^{-3}$ Al$_{0.16}$Ga$_{0.84}$As), active region 13 (e.g., 0.2 μm nominally undoped GaAs), lightly p-type upper cladding layer 14 (e.g., 1.5 μm $5 \times 10^{17}$ cm$^{-3}$ Al$_{0.16}$Ga$_{0.84}$As), and contact layer 15 (e.g., 5 nm p++GaAs).

Numerals 16 refer to a proton-implanted region that defines the emitting area, and numerals 17 refer to p-side contact metal (e.g., Au-Be) layer that has a window aligned over the unimplanted region. Numeral 19 refers to n-side contact metal (e.g., Au-Be) layer, and means 191 facilitate flowing an electric current through the layer structure. On dielectric antireflection layer 192 (e.g., 120 nm Al$_2$O$_3$) is deposited transparent conducting layer 193 (e.g., about 20 nm indium-tin oxide). On thin transparent (e.g., quartz glass) plate 194 is deposited transparent conducting (e.g., InSnO$_x$) layer 195, with dielectric reflection means 196 (e.g., four pairs of CaF$_2$ and SiO$_2$ layers, each layer of thickness $\lambda/4$) thereon. Appropriate means (e.g., commercially available epoxy 197 with 50 μm diameter glass beads 198 therein) serve to maintain the second body (comprising plate 194) in fixed relationship with the first body (comprising the semiconductor layer structure), with a space between the two bodies. This space contains electro-optic (e.g., liquid crystal) material 199. Desirably, the second body is essentially parallel to the surface of the first body (and therefore to reflection means 11), and any spacer means that can provide such parallelity are contemplated. Exemplary of such spacer means are the above mentioned microspheres and lithographically defined deposited "posts". Means 190 facilitate application of an electric field across the electro-optic material. Desirably, layer 193 and the electro-optic material are index matched so that the optical impedance of antireflection coating 192 matches, in known manner, the semiconductor structure and the material above it.

As those skilled in the art will appreciate, the laser cavity is formed by reflection means 11 and 196, with electro-optic material 199 thus being within the cavity. In currently preferred embodiments the electro-optic material is liquid crystal (LC) material. As is well known, the refractive index of LC material typically is a function of the electric field across the material, with significant changes in refractive index attainable with relatively small applied fields. For instance, in a 50 μm thick layer of a commercially available LC material (Merck ZL1-3103) $\Delta n/n$ is about 0.08 for a 2 V change in applied voltage.

The attainable wavelength tuning range $\Delta\lambda$ in laser means as shown in FIG. 1 is approximately equal to $\lambda f \Delta n/n$, where $\lambda$ is the nominal laser frequency (e.g., 850 nm), and f is the fraction of the effective length of the laser cavity that is occupied by electro-optic material. A value of $f=\frac{1}{2}$ is easily attainable in practice. Using these values (e.g., f=0.5, $\Delta n/n=0.08$, $\lambda=850$ nm), one finds that the exemplary tuning range is about 34 nm, considerably greater than the range of prior art Peltier effect tunable lasers. Suitable design can of course result in even greater f, suitable choice of electro-optic material can result in somewhat greater $\Delta n/n$ per unit change in the applied field, and the maximum change in applied voltage can be greater than 2 V, making possible even greater tuning ranges. Of course, the tuning range cannot exceed the width of the optical gain spectrum, which exemplarily is about 40 nm in a VCSEL of the above described type.

Figure 2:
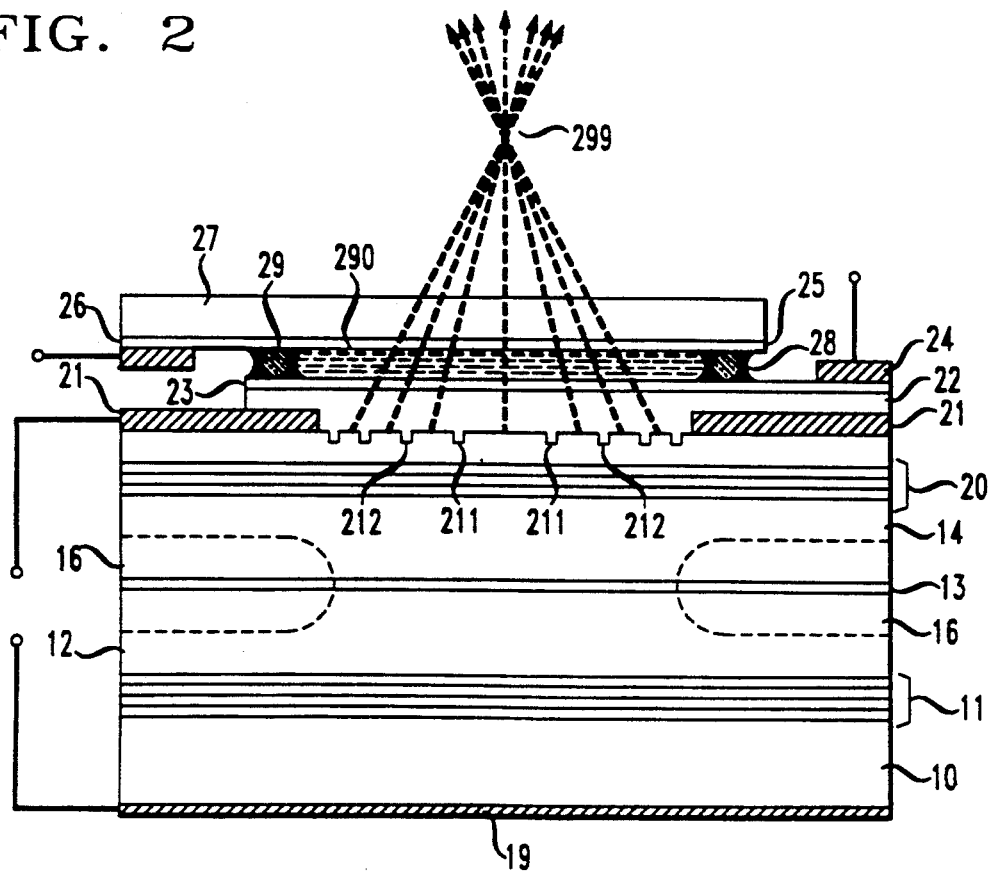

FIG. 2 schematically depicts a further exemplary embodiment of the invention, namely, VCSEL means having focused output radiation with tunable focal length. For a detailed description of the novel laser with focusing means (to be referred to as the Z-laser), see the concurrently filed patent application by D. Vakhshoori entitled "Article Comprising a Semiconductor Laser and Focusing Means", Ser. No. 08/026,375 incorporated herein by reference. Exemplarily, the laser structure is similar to that of FIG. 1 but further comprises p-type multilayer semiconductor reflection means 20, with appropriately dimensioned and spaced circular concentric trenches 211, 212 ... in the top surface of the multilayer semiconductor structure. Contact means 21 facilitate flowing a current through the semiconductor structure. A thin metal layer that covers the top surface of the semiconductor structure (including the trenches) is not shown, for clarity's sake. The layer is further described in the concurrently filed application. Dielectric layer 22 separates 21 from further contact layer (typically InSnO$_x$) 23. The second body comprises transparent plate 27 with conducting layer (typically InSnO$_x$) 26, and is held fixed with respect to the first body by appropriate means, e.g., epoxy 28 with spacer means 29 therein. The space between first and second body contains electro-optic (typically LC) material 290, and contact means 24 and 25 facilitate applying an electric field across the electro-optic material. Output radiation is brought to focus 299, as described in detail in the concurrently filed application.

As those skilled in the art will appreciate, in a Z-laser as shown in FIG. 2 the focal length changes by approximately $(\Delta n/n)(1/L)$ upon a change of the electric field across the electro-optic material. In this expression 1 is the thickness of the layer of electro-optic material and L is the nominal focal distance. Thus, for the exemplary values $\Delta n/n=0.08$, $1=50$ μm and $L=100$ μm, the change in focal length is about 4%. Larger changes are of course attainable.

Figure 3:
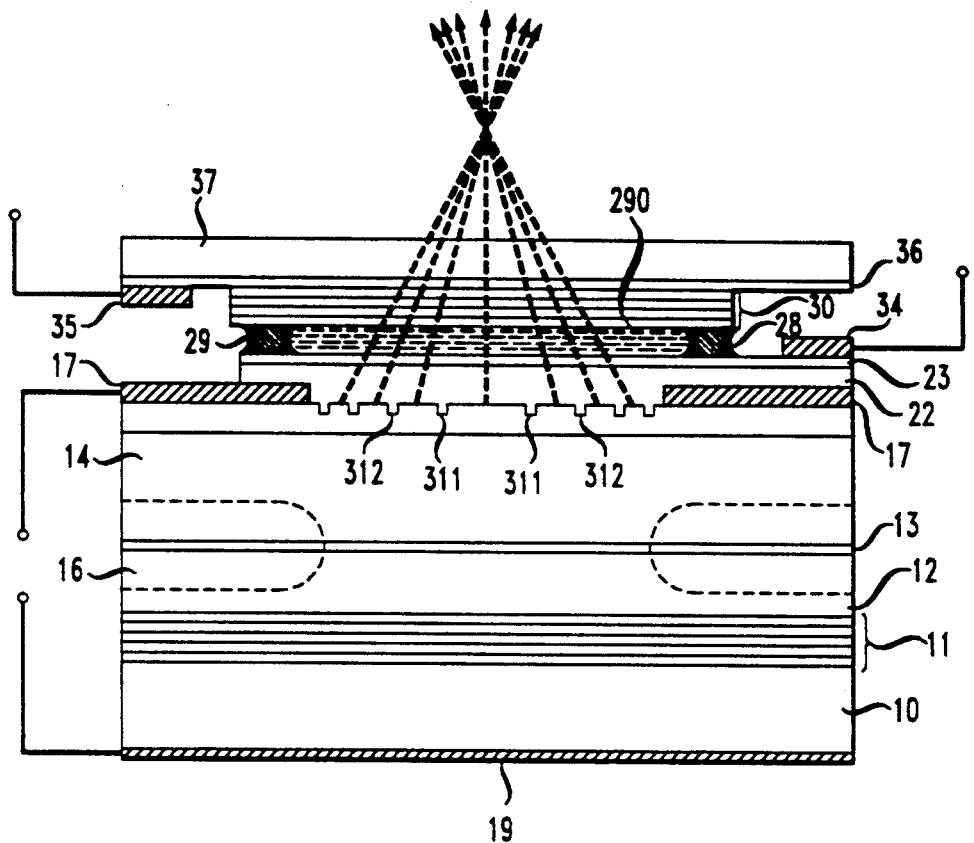

FIG. 3 schematically shows another exemplary embodiment of the invention, namely, VCSEL laser means that are tunable with respect to both wavelength and focal length. The multilayer semiconductor structure is substantially as shown in FIG. 2, except that the structure does not comprise second reflector means 20. Concentric circular trenches 311, 312 ... are shown in the top surface of the semiconductor structure, but alternately could be formed in dielectric layer (antireflection coating) 22 or in transparent conducting layer 23. The second body comprises transparent plate 37, with transparent conducting layer 36 and reflector means 30 thereon. Appropriate means hold the second body fixed with respect to the first body, with a space therebetween. The space contains electro-optic material 290, and contact means 34 and 35 facilitate application of an electric field across the electro-optic material, whereby output wavelength and focal length can be varied.

Semiconductor layer structures that are useful in the practice of the invention can be readily produced by conventional semiconductor manufacturing techniques, including growth by MBE or MOCVD, and patterning by photolithography and etching. The structures typically comprise known III/V compound semiconductor material, e.g., GaAs, InP, AlGaAs, InAlGaAs, etc. The non-semiconductor portions of the first body can also be readily fabricated by known means, e.g., vapor deposition of contact metal. Furthermore, the second body can also be produced by known techniques, e.g., vapor deposition of indium-tin oxide.

Figure 4:
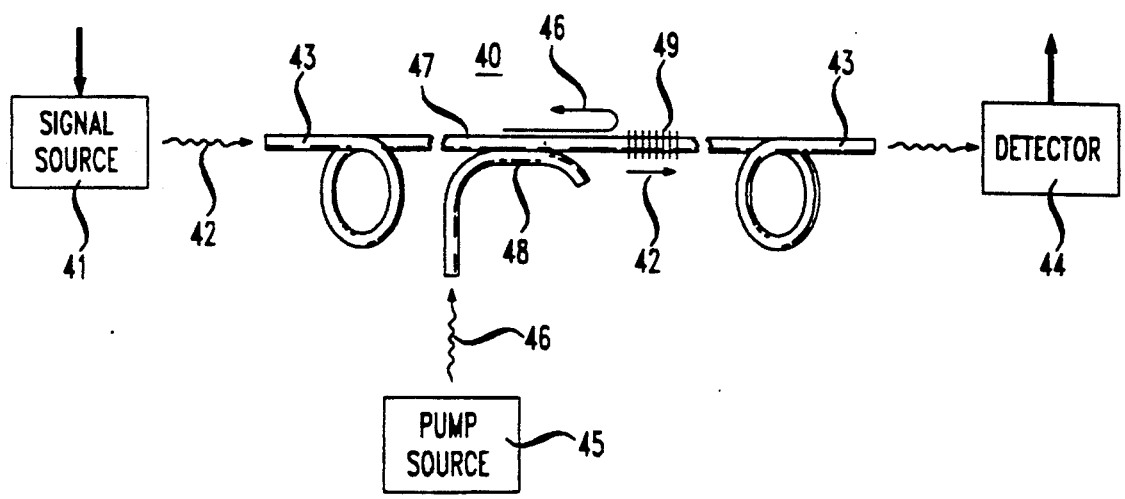
FIG. 4 shows schematically an exemplary article according to the invention, namely, an optically pumped optical fiber communication system that comprises one or more laser means according to the invention.

FIG. 4 schematically depicts an exemplary article according to the invention, namely, an optical fiber communication system. Signal source 41 emits output radiation 42 in response to an external signal. The radiation is coupled into optical fiber 43 and transmitted through optical fiber to detector means 44, which provide an electrical output in response to the received optical signal. Optionally the system comprises an optical amplifier intermediate signal source and detector. The amplifier comprises a length of amplifier fiber 47, a pump source 45 that emits pump radiation 46, means 48 for coupling pump radiation into the amplifier fiber, and grating means 69 that reflect pump radiation but pass signal radiation. Either or both of signal source and pump source comprise laser means according to the invention.

We claim:

1. An article comprising tunable laser means comprising a) a first body having a major surface and comprising a semiconductor layer structure including multilayer semiconductor reflection means and an active region, located between said reflection means and said major surface, with said reflection means and active region being essentially parallel with said major surface, and further comprising first contact means that facilitate flowing an electric current through said semiconductor layer structure such that the laser means has a radiation output;

b) a quantity of electro-optic material; and c) second contact means that facilitate applying an electric field across said electro-optic material;

Characterized in That d) the quantity of electro-optic material comprises a layer of electro-optic material in contact with said major surface; and e) the second contact means comprise a first and a second contact layer, with said first body comprising said first contact layer and a second body comprising said second contact layer, the laser means further comprising means for maintaining said second body in fixed relationship with said first body.

2. Article according to claim 1, wherein said second body comprises further reflection means that are essentially parallel with said major surface, and wherein the wavelength of said radiation output is a function of the electric field that is applied across the layer of electro-optic material.

3. Article according to claim 2, wherein said first body comprises means for bringing the radiation output substantially to a focus, the distance between said focus and the major surface being a function of the electric field that is applied across the layer of electro-optic material.

4. Article according to claim 1, wherein said first body comprises further reflection means that are essentially parallel with said major surface and are located between the active region and the major surface, and wherein said first body comprises means for bringing the radiation output substantially to a focus, the distance between said focus and the major surface being a function of the electric field that is applied across the layer of electro-optic material.

5. Article according to claim 1, wherein said layer of electro-optic material comprises liquid crystal material.

6. Article according to claim 1, wherein the means for maintaining the second body in fixed relationship with the first body comprise spacer means.

7. Article according to claim 1, wherein the first body comprises means for bringing the radiation output substantially to a focus, with the distance between the focus and the major surface being a function of the electric field that is applied across the layer of electro-optic material, and wherein said means for bringing the radiation output substantially to a focus comprise a multiplicity of substantially circular, substantially concentric features in or on the first body.

8. Article according to claim 1, further comprising means for receiving said radiation output.

* * * * *